(12) United States Patent
Andou

(10) Patent No.: US 10,636,784 B2
(45) Date of Patent: Apr. 28, 2020

(54) DISPLAY DEVICE AND METHOD FOR MANUFACTURING DISPLAY DEVICE

(71) Applicant: Japan Display Inc., Tokyo (JP)

(72) Inventor: Naohisa Andou, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/201,137

(22) Filed: Nov. 27, 2018

(65) Prior Publication Data

US 2019/0164955 A1 May 30, 2019

(30) Foreign Application Priority Data

Nov. 30, 2017 (JP) ................. 2017-229927

(51) Int. Cl.
| | |
|---|---|
| H01L 27/02 | (2006.01) |
| H01L 27/32 | (2006.01) |
| H01L 51/56 | (2006.01) |
| H01L 51/00 | (2006.01) |

(52) U.S. Cl.
CPC ...... *H01L 27/0296* (2013.01); *H01L 27/0255* (2013.01); *H01L 27/3276* (2013.01); *H01L 51/56* (2013.01); H01L 51/0097 (2013.01); H01L 2227/323 (2013.01); H01L 2251/5338 (2013.01); H01L 2251/5392 (2013.01); H01L 2251/566 (2013.01)

(58) Field of Classification Search
CPC ...................................... H01L 27/02
See application file for complete search history.

(56) References Cited

U.S. PATENT DOCUMENTS

| | | | | |
|---|---|---|---|---|
| 2002/0140646 A1* | 10/2002 | Sato | ............ | G09G 3/3233 345/82 |
| 2014/0084792 A1* | 3/2014 | Oh | ............ | H05B 37/02 315/120 |
| 2015/0138253 A1* | 5/2015 | Kimura | ............ | G09G 3/3266 345/690 |
| 2015/0146129 A1* | 5/2015 | Sugihara | ............ | G09G 3/3233 349/46 |
| 2017/0236853 A1* | 8/2017 | Sagawa | ............ | H01L 27/3211 257/40 |

FOREIGN PATENT DOCUMENTS

JP 2016-042130 A 3/2016

* cited by examiner

*Primary Examiner* — Thao P Le
(74) *Attorney, Agent, or Firm* — Michael Best & Friedrich LLP

(57) ABSTRACT

A display device includes a substrate; a plurality of pixels on the substrate; a drive circuit on the substrate; a first terminal and a second terminal connected to the pixels or the drive circuit and arranged on the substrate; a first wiring having a first end part connected with the first terminal, and a second end part located on an end part of the substrate; a second wiring having a third end part connected with the second terminal, and a fourth end part located on an end part of the substrate; a first current blocking unit blocking a current flowing in a direction from the second end part to the first end part of the first wiring; and a second current blocking unit blocking a current flowing in a direction from the fourth end part to the third end part of the second wiring.

9 Claims, 18 Drawing Sheets

DISPLAY DEVICE AND METHOD FOR MANUFACTURING DISPLAY DEVICE

CROSS REFERENCE TO RELATED APPLICATIONS

This application is based upon and claims the benefit of priority from the prior Japanese Patent Application No. 2017-229927, filed on Nov. 30, 2017, the entire contents of which are incorporated herein by reference.

FIELD

One embodiment of the present invention is related to a display device and a method of manufacturing the display device.

BACKGROUND

A display device such as organic electroluminescence (EL: Electro Luminescence) has a structure in which a display part and a plurality of terminals is arranged on a substrate, for example. The plurality of terminals is electrically connected to the display part, and various signals (for example, data signals or control signals) or a power supply potential are input. In order to prevent electronic components from being electrostatically broken during the manufacture of a display device, a short-circuit wire (short ring) for short-circuiting the plurality of terminals is sometimes arranged (for example, Japanese Laid-Open Patent Application No. 2016-42130). The short-circuit wiring is removed from the display device before the product is shipped.

SUMMARY

One aspect of the present invention is a display device including a substrate, a plurality of pixels on the substrate, a first terminal and a second terminal on the substrate, a first wiring having a first end part electrically connected with the first terminal, and a second end part located on an end part of the substrate, a second wiring having a third end part electrically connected with the second terminal, and a fourth end part located on an end part of the substrate, a first current blocking unit blocking a current flowing a direction from the second end part to the first end part of the first wiring, and a second current blocking unit blocking a current flowing a direction from the fourth end part to the third end part of the second wiring.

One aspect of the present invention is manufacturing method of a display device including a pixel region arranged with a plurality of pixels, a substrate having a terminal part arranged with a plurality of terminals, and a current blocking unit between each of the plurality of terminals and an end part of the substrate, the current blocking unit blocking a current flowing to the terminal, the method includes forming a first transistor in the pixel region, forming a second transistor, a third transistor, a fourth transistor and a fifth transistor in the current blocking unit, forming a first terminal and a second terminal in the terminal part, forming a first wiring electrically connected to the first transistor, a second wiring electrically connected to the first terminal and the second transistor, a third wiring electrically connected to the second transistor and the third transistor, a fourth wiring electrically connected to the third transistor and the fourth transistor, a fifth wiring electrically connected to the fourth transistor and the fifth transistor, and a sixth wiring electrically connected to the fifth transistor and the second terminal, forming a light emitting element electrically connected with the first transistor, and cutting the substrate with a laser and dividing the fourth wiring.

One aspect of the present invention is manufacturing method of a display device having a first terminal and a second terminal adjacent to each other, a first current blocking unit between the first terminal and an end part of the substrate, the first current blocking unit blocking a current flowing to the first terminal, and a second current blocking unit located between the second terminal and the end part of the substrate, the second current blocking unit blocking a current flowing to the second terminal, the method includes forming a second transistor and a third transistor in the first current blocking unit, forming a fourth transistor and a fifth transistor in the second current blocking unit, forming, a second wiring electrically connected to the first terminal and the second transistor, a third wiring electrically connected to the second transistor and the third transistor, a fourth wiring electrically connected to the third transistor and the fourth transistor, a fifth wiring electrically connected to the fourth transistor and the fifth transistor, and a sixth wiring electrically connected to the fifth transistor and the second terminal, and cutting the substrate between the first current blocking unit and the end part, and between second current blocking unit and the end part and dividing the fourth wiring.

DESCRIPTION OF EMBODIMENTS

Each embodiment of the present invention is explained below while referring to the diagrams. Furthermore, the disclosure is merely an example and what could be easily conceived by a person ordinarily skilled in the art by appropriate modification while maintaining the concept of the invention is to be naturally included in the scope of the present invention. In addition, although the width, thickness and shape of each component are shown schematically compared to their actual form in order to better clarify explanation, the drawings are merely an example and should not limit an interpretation of the present invention.

In addition, in the specification and each drawing, the same reference symbols are attached to similar elements and elements that have been mentioned in previous drawings, and therefore a detailed explanation may be omitted where appropriate. Furthermore, characters denoted by "first" and "second" attached to each element are appropriate symbols used for distinguishing each element and do not have any further meaning unless otherwise stated.

In addition, in the present specification, in the case where certain parts or regions are given as "above (or below)" other parts or regions, as long as there is no particular limitation, these include parts which are not only directly above (or directly below) other parts or regions but also in an upper direction (or lower direction). That is, the case where other structural elements are included between other parts or regions in an upper direction (or lower direction) is included. Furthermore, in the explanation herein, unless otherwise noted, in a cross-sectional view, a side where a second substrate is arranged with respect to a first substrate is referred to as [above] or [upper] and the reverse is referred to as [below] or [lower].

In addition, the expressions "a includes A, B or C", "a includes any one of A, B and C", and "a is one selected from a group consisting of A, B, and C", unless otherwise specified does not exclude the case where a includes a plurality of combinations of A to C. Furthermore, these expressions do not exclude the case where α includes other elements.

A part or all of a plurality of terminals may be in a short-circuited state after a step of removing short-circuit wiring from the display device. For example, in the case when a substrate including a resin (for example, an organic resin substrate) is cut using a laser, the resin included in the substrate is carbonized. Since a carbonized region has conductivity, terminal pairs sometimes short-circuit each other.

1. STRUCTURE OF DISPLAY DEVICE

Figure 1:
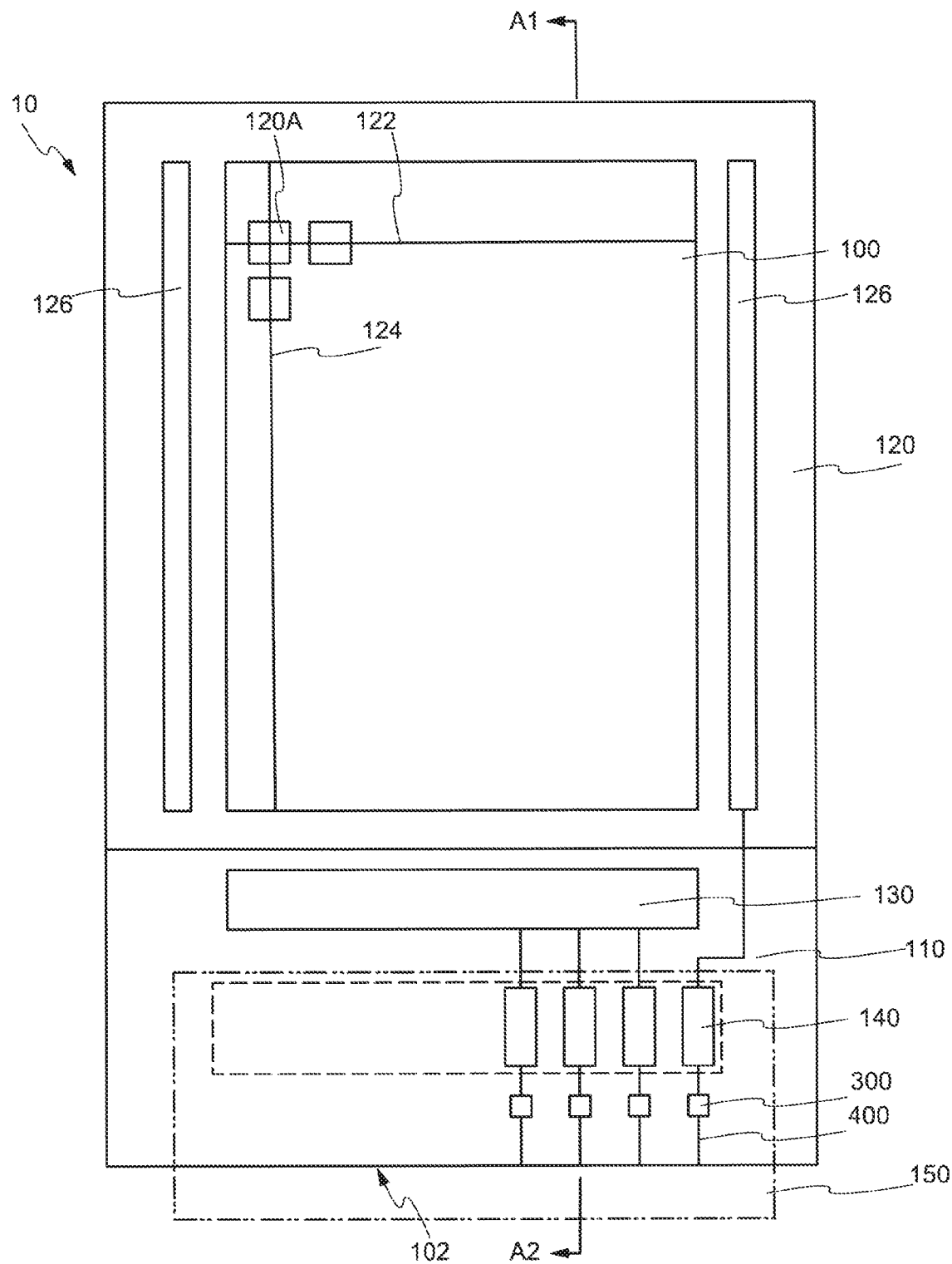
FIG. 1 is a top view showing a structure of a display device related to one embodiment of the present invention.

FIG. 1 shows a structure of a display device 10 according to one embodiment of the present invention. FIG. 1 shows a top view of the display device 10. The display device 10 is an organic EL display device. The display device 10 is a flexible display device and is formed thinly as a whole. The display device 10 is arranged with a substrate 110, a display part 120, a drive circuit 130, a plurality of terminals 140, a flexible printed circuit 150 and a plurality of wirings 400.

The substrate 110 is a substrate which has plasticity. In this case, the substrate 110 may be referred to as a base material, a base film, or a sheet substrate. Here, the substrate 110 is an organic resin substrate containing a resin. The organic resin material which forms the substrate 110 is, for example, polyimide, acrylic, epoxy or polyethylene terephthalate. The thickness of the substrate 110 is, for example, between 10 μm and several hundred micrometers.

The display part 120, the drive circuit 130 and the plurality of terminals 140 are arranged on the upper surface of the substrate 110.

The display part 120 displays a still image or a moving image in a display region 100. The drive circuit 130 and the plurality of terminals 140 are arranged in a periphery region along the same side of the display region 100 in the periphery region of the display region 100. The drive circuit 130 is arranged between the display region 100 and the plurality of terminals 140.

The display part 120 includes not only the display region 100 but also a pair of scanning line drive circuits 126. The display part 120 includes a plurality of scanning lines 122 extending in a first direction and a plurality of data signal lines 124 extending in a second direction intersecting the first direction in the display region 100. The pair of scanning line drive circuits 126 are arranged at positions which face each other interposed by the display region 100 therebetween. The pair of scanning line drive circuits 126 are arranged in a periphery region which is different from the drive circuit 130 and the plurality of terminals 140 in the periphery region of the display region 100. The pair of scanning line drive circuits 126 select the scanning lines 122 electrically connected thereto in a predetermined sequence and supply control signals.

The drive circuit 130 drives the display part 120 to control light emitted by a plurality of pixels 120A. The drive circuit 130 supplies a data voltage to the plurality of data signal lines 124 in a predetermined sequence. The drive circuit 130 may also control the scanning line drive circuit 126. The drive circuit 130 includes, for example, an integrated circuit such as an ASIC (Application Specific Integrated Circuit).

The pixel 120A is arranged corresponding to each intersection of the plurality of scanning lines 122 and the plurality of data signal lines 124. Here, the plurality of pixels 120A are arranged in an array shape. The pixel 120A includes a pixel circuit for controlling light emission based on a control signal and a data voltage, and a light emitting element (for example, an organic light emitting diode) which has light emission controlled by the pixel circuit. The pixel circuit includes, for example, a thin film transistor and a capacitor. The pixel circuit controls the light emitted by the light emitting element by driving the thin film transistor using the control signal and the data voltage. The thin film transistor controls light emitted by the light emitting element based on a signal from the flexible printed circuit 150 or a signal from the drive circuit 130. Furthermore, in FIG. 1, only a part of each of the plurality of scanning lines 122, the plurality of data signal lines 124, the plurality of pixels 120A and the plurality of terminals 140 is shown.

The plurality of terminals 140 are electrically connected to the flexible printed circuit 150. Each of the plurality of terminals 140 is electrically connected to the display part 120 or the drive circuit 130. A signal or a power supply potential which is supplied from the flexible printed circuit 150 is input to the plurality of terminals 140. This signal is a signal for operating the display part 120, for example, a data signal which indicates an image to be displayed in the display region 100, or a control signal for controlling the scanning line drive circuit 126 or the drive circuit 130. Furthermore, the number of terminals 140 which are arranged in the display device 10 may be any number as long as it is plural.

The flexible printed circuit 150 outputs a signal input from an external circuit (not shown in the diagram) to the plurality of terminals 140. The flexible printed circuit 150 has a structure in which a plurality of wirings is arranged on a flexible substrate. Each of the plurality of wirings is electrically connected to one of the terminals 140.

Each of the plurality of wires 400 has two end parts. Each of the plurality of wirings 400 has an end part which is electrically connected to the terminal 140 and an end part which is located at an end part 102. That is, when the display device 10 is viewed from the upper surface, the end part 102 and the end parts of the plurality of wirings 400 exist at the same position. The manufacturing process of the display device 10 includes a cutting process of cutting the substrate 110 in order to shape the display device 10. The end part 102 is an end part (that is, a cutting end part) of the substrate 110 formed by this cutting process. A current blocking unit 300 is arranged in each of the plurality of wirings 400. The current blocking unit 300 blocks a current flowing in the direction of the terminal 140.

Figure 2:
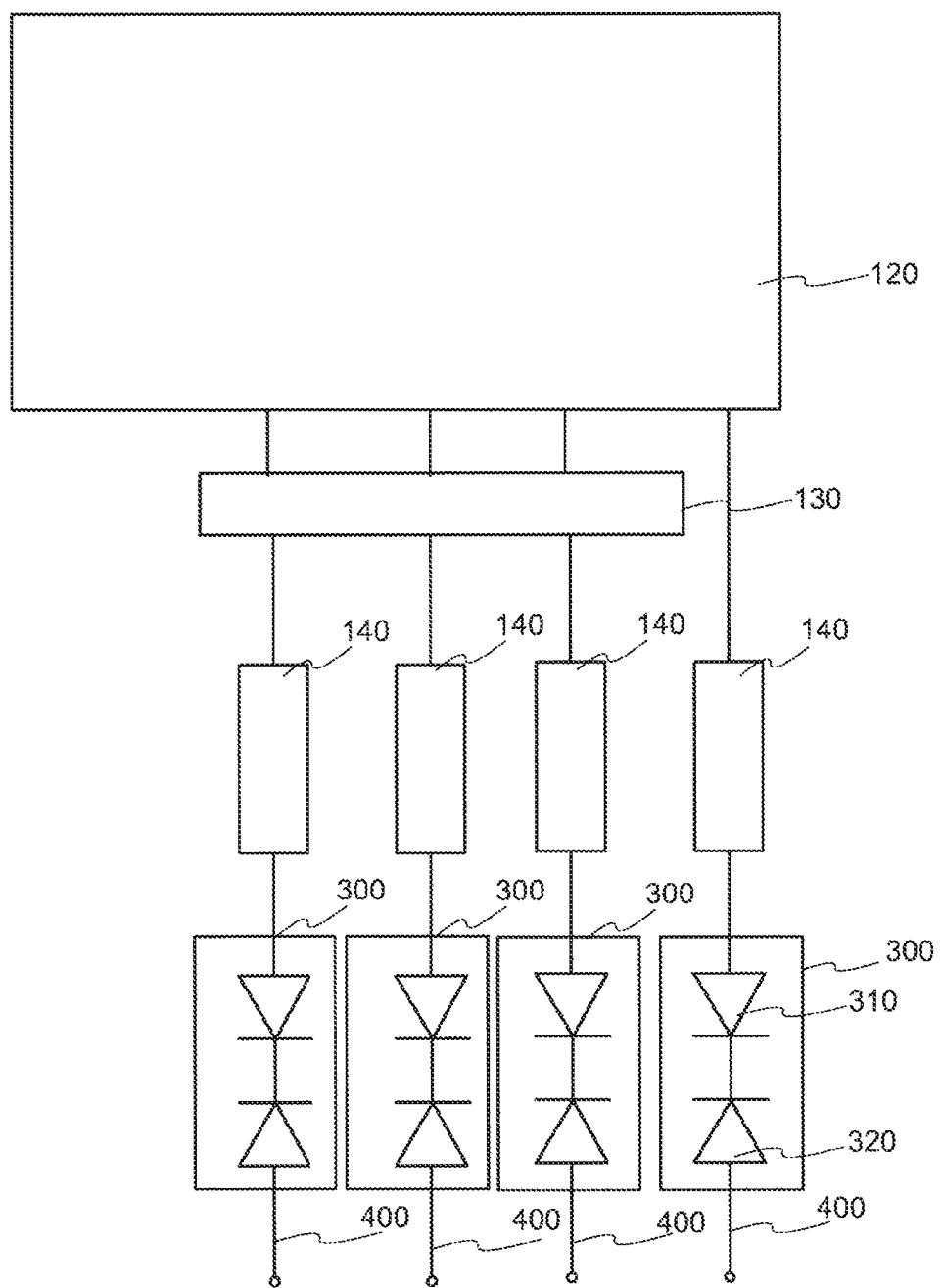
FIG. 2 shows a current blocking unit and the electrical structure of a periphery thereof of a display device related to one embodiment of the present invention.

FIG. 2 shows an electrical structure between the current blocking unit 300 and a periphery thereof. The current blocking unit 300 includes a first rectifier element 310 and a second rectifier element 320 which face in mutually opposite directions. The first rectifier element 310 blocks a current flowing in the direction of the terminal 140 of the wiring 400. The second rectifier element 320 is a rectifier element which faces in a reverse direction to the first rectifier element 310. The second rectifier element 320 blocks a current flowing in the direction of the end part 102 of the wiring 400. The first rectifier element 310 is arranged at a position closer to the terminal 140 than the second rectifier element 320. The wiring 400 is an open end at the end part 102.

Figure 3:
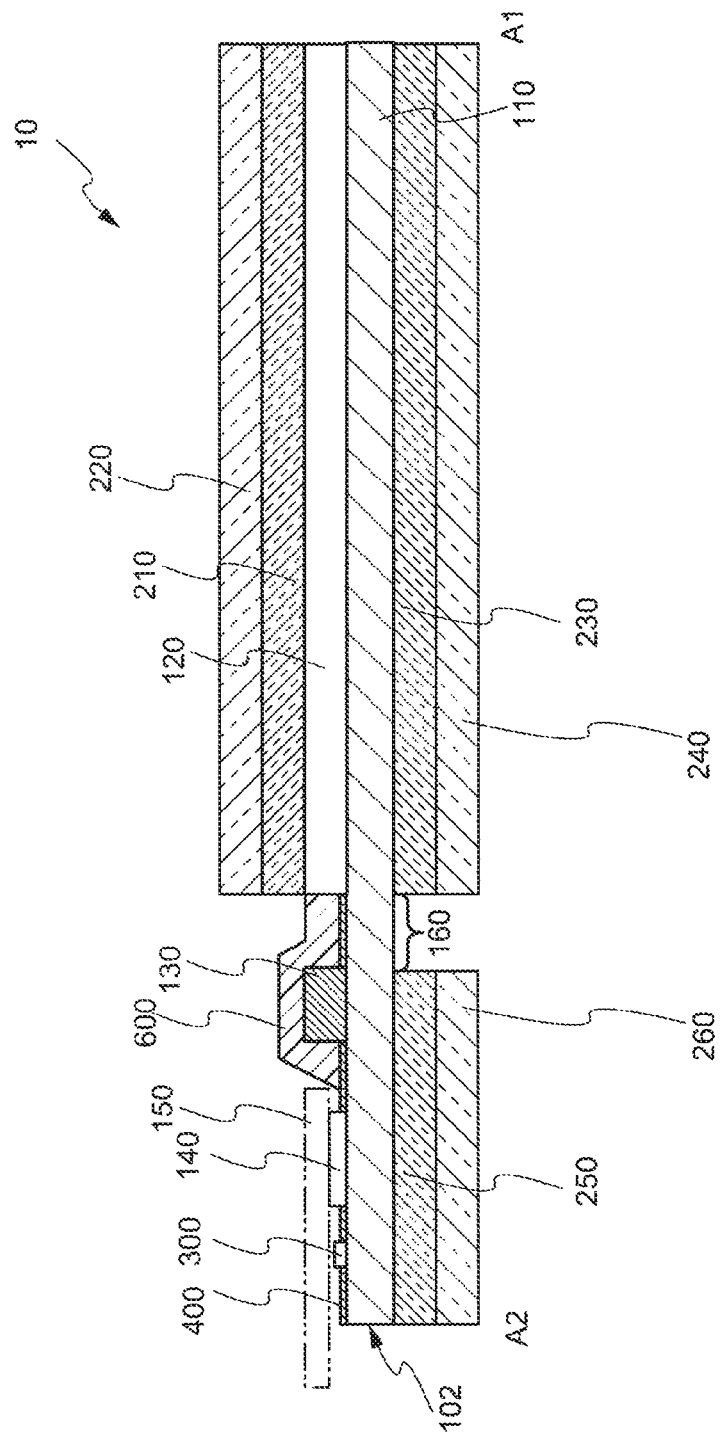
FIG. 3 is a cross-sectional view showing a structure of a display device related to one embodiment of the present invention.

FIG. 3 is a cross-sectional view (cross-sectional view along the line A1-A2 in FIG. 1) showing the structure of the display device 10. Specifically, FIG. 3 shows a cross section in the case when the display device 10 is cut at a position which passes through the display part 120, the drive circuit 130 and the terminal 140. A first film 210 and a second film 220 are stacked and arranged on the display part 120 on the upper surface side of the display device 10. A third film 230 and a fourth film 240 are stacked and arranged in a region on the opposite side to the display part 120 interposed with the substrate 110 therebetween on the lower surface side of the display device 10. An intermediate region 160 shown in FIG. 3 is a region between the display unit 120 and the drive circuit 130, and is a region in which it is possible to fold the display device 10. A film is not arranged in the intermediate region 160 in order to make this folding easier. However, for example, a thin film may be arranged in the intermediate region 160. A fifth film 250 and a sixth film 260 are stacked and arranged in a region on the opposite side of the drive circuit 130 and the terminal 140 which sandwich the substrate 110 on the lower surface side of the display device 10.

Each film described above is bonded to each region using an adhesive for example. Each film may also include an organic resin film. The organic resin film is, for example, a film including polyimide, acrylic, epoxy, polyethylene terephthalate or silicone organic resin. The organic resin film may include an inorganic material or may be formed using a metal material such as stainless steel or copper. However, it is preferred that the first film 210 and the second film 220 have translucency so that the visibility of an image displayed in the display region 100 is not obstructed. Although the thickness of each film may be set considering each object to be protected, it is, for example, within a range of 100 μm to 200 μm.

The drive circuit 130 is adhered to the substrate 110 using an adhesive 600. The adhesive 600 includes a resin and includes a material that is cured by ultraviolet rays. The adhesive 600 may include, for example, an ultraviolet (UV) cured film. The UV cured film includes, for example, a polymerized resin such as an acrylic resin or an epoxy resin.

Figure 4:
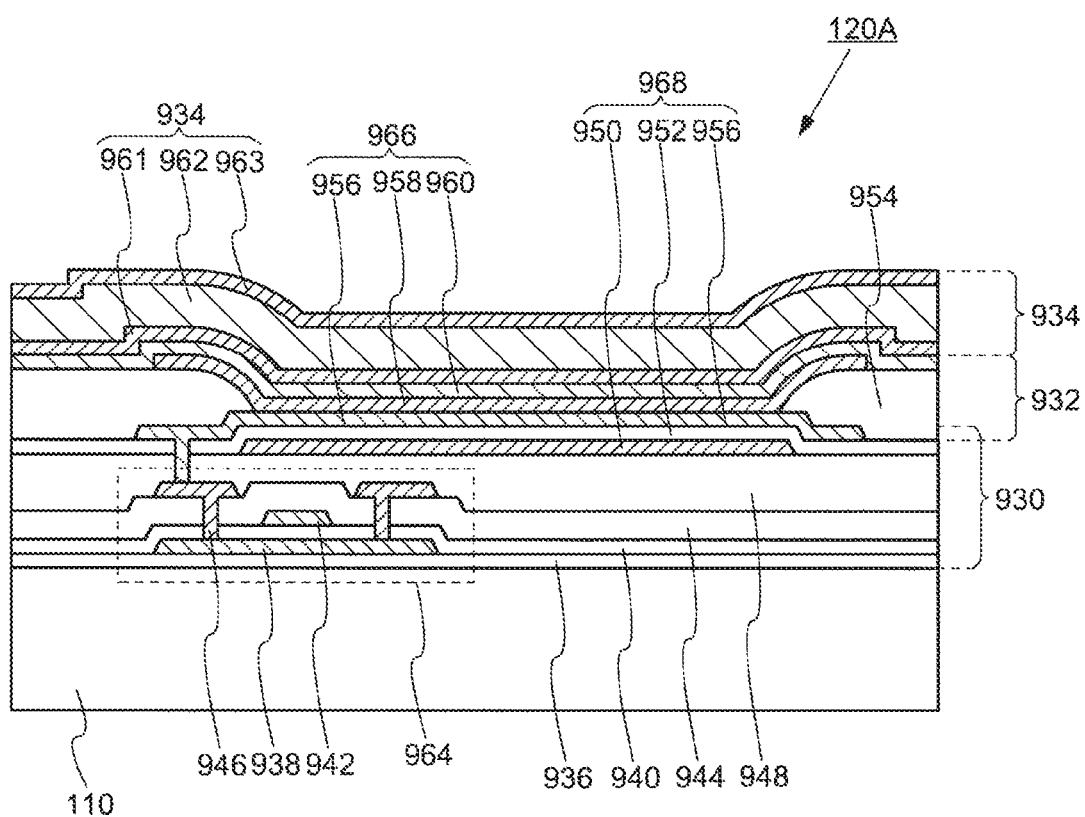
FIG. 4 is a cross-sectional view showing a structure of a pixel of a display device related to one embodiment of the present invention.

The detailed structure of the display device 10 is explained. FIG. 4 shows a cross-sectional structure of the pixel 120A in the display device 10. The pixel 120A includes at least one transistor 964, a light emitting element 966 and a capacitor 968. The transistor 964, the light emitting element 966 and the capacitor 968 are electrically connected to each other. In the transistor 964, a current (drain current) which flows between the source and drain is controlled by a voltage applied to the gate. The light emission intensity of the light emitting element 966 is controlled by the drain current. The capacitor 968 is connected between the gate and source of the transistor 964 so that a gate voltage is applied thereto and is arranged to maintain a constant gate voltage constant.

In FIG. 4, a drive element layer 930 includes a first insulating layer 936, a semiconductor layer 938, a second insulating layer 940, a gate electrode 942, a third insulating layer 944, a source/drain wiring 946, a fourth insulating layer 948, a capacitor electrode 950, a fifth insulating layer 952 and a first electrode 956. A display element layer 932 includes a first electrode 956, a partition wall 954, an organic layer 958 and a second electrode 960. In addition, a sealing layer 934 includes a first inorganic insulating film 961, an organic resin film 962 and a second inorganic insulating film 963.

In the drive element layer 930, the transistor 964 has a structure in which the semiconductor layer 938, the second insulating layer 940 (gate insulating layer) and the gate electrode 942 arranged above the first insulating layer 936 are stacked. The semiconductor layer 938 is made of a semiconductor material such as amorphous silicon or polycrystalline silicon or metal oxide. The semiconductor layer 938 is insulated from the gate electrode 942 by the second insulating layer 940. The third insulating layer 944 is arranged on the upper layer side of the gate electrode 942. The source/drain wiring 946 is arranged on the upper layer side of the third insulating layer 944. The source/drain wiring 946 contacts the semiconductor layer 938 through a contact hole formed in the third insulating layer 944. The first insulating layer 936 and the second insulating layer 940 are formed using an inorganic insulating material such as silicon oxide, silicon nitride or silicon oxynitride. The gate electrode 942 and the source/drain wiring 946 are formed using a metal material such as aluminum (Al), molybdenum (Mo), titanium (Ti) or tungsten (W) and the like.

The fourth insulating layer 948 is arranged above the source/drain wiring 946. The fourth insulating layer 948 is used as a planarization film which buries irregular surfaces formed by the semiconductor layer 938, the gate electrode 942 and the source/drain wiring 946, and flattens the surface. The fourth insulating layer 948 is formed from an organic insulating material such as polyimide or acrylic.

The capacitor electrode 950 is arranged on the upper surface of the fourth insulating layer 948, and the fifth insulating layer 952 is further formed. Furthermore, the first electrode 956 is arranged on the upper surface of the fifth insulating layer 952. The first electrode 956 is electrically connected to the source/drain wiring 946 through a contact hole passing through the fifth insulating layer 952 and the fourth insulating layer 948. The first electrode 956 is arranged to overlap the capacitor electrode 950 interposed by the fifth insulating layer 952 therebetween. The capacitor 968 is formed in a region where the capacitor electrode 950, the fifth insulating layer 952 and the first electrode 956 overlap. The fifth insulating layer 952 which is used as a dielectric film of the capacitor 968 is made of an inorganic insulating material such as silicon nitride, silicon oxide or silicon nitride oxide and the like.

The display element layer 932 is arranged substantially above the fifth insulating layer 952. The partition wall 954 which covers the periphery part and exposes the inner region of the first electrode 956 is arranged above the fifth insulating layer 952. The organic layer 958 is arranged to cover the surface of the partition wall 954 from the upper surface of the first electrode 956. The second electrode 960 is arranged to cover the upper surfaces of the organic layer 958 and the partition wall 954. The light emitting element 966 is formed by the first electrode 956, the organic layer 958 and the second electrode 960. In the light emitting element 966, a region where the first electrode 956, the organic layer 958 and the second electrode 960 overlap is a light emitting region. The sixth insulating layer is formed from an organic resin material in order to form a smooth step at the opening end which exposes the first electrode 956. An acrylic resin, a polyimide resin or a polyamide resin and the like is used as the organic resin material.

The organic layer 958 is formed using a low molecular or high molecular weight organic EL material. When a low molecular weight organic EL material is used, in addition to a light emitting layer which includes an organic EL material, the organic layer 958 is appropriately arranged with a carrier injection layer (hole injection layer, electron injection layer), and a carrier transport layer (hole injection layer, electron injection layer) which sandwich the light emitting layer. For example, the organic layer 958 may have a structure in which a light emitting layer is sandwiched between a hole injection layer and an electron injection layer. Furthermore, in addition to the hole injection layer and the electron injection layer, a hole transport layer, an electron transport layer, a hole blocking layer and an electron blocking layer and the like are appropriately added to the organic layer 958.

In the present embodiment, the light emitting element 966 is a so-called top emission type which radiates light emitted from the organic layer 958 to the second electrode 960 side. The first electrode 956 is a metal film or is formed including a metal film in order to reflect light emitted from the organic layer 958. For example, the first electrode 956 is preferred to be formed including a metal film having high light reflectance in the visible light band such as aluminum (Al) or silver (Ag) and the like. In addition, the first electrode 956 may also be formed by stacking a transparent conductive film such as indium tin oxide (also referred to as "ITO" below), indium zinc oxide (also referred to as "IZO" below), aluminum doped zinc oxide (also referred to as "AZO" below) or gallium-doped zinc oxide (also referred to as "GZO") and a metal film. The second electrode 960 is formed from a transparent conductive film such as ITO, IZO, AZO or GZO and the like since it transmits light emitted by the organic layer 958. The second electrode 960 is arranged over substantially the entire surface of the organic layer 958.

The sealing layer 934 is arranged on the upper surface of the second electrode 960. The sealing layer 934 is formed form an inorganic insulating film. In addition, as is shown in FIG. 4, the sealing layer 934 may also be formed from the first inorganic insulating film 961, the organic resin film 962 and the second inorganic insulating film 963. The first inorganic insulating film 961 and the second inorganic insulating film 963 are inorganic insulating materials such as a silicon nitride film and an aluminum oxide film for example. The organic resin film is, for example, an acrylic resin, a polyimide resin, a polyamide resin or an epoxy resin.

In the structure of the pixel 120A shown in FIG. 4, the drive element layer 930 has a thickness of approximately 2 μm to 5 μm. The display element layer 932 has a thickness of approximately 1 μm to 3 μm. The sealing layer 934 has a thickness of approximately 10 μm to 20 μm.

Figure 5:
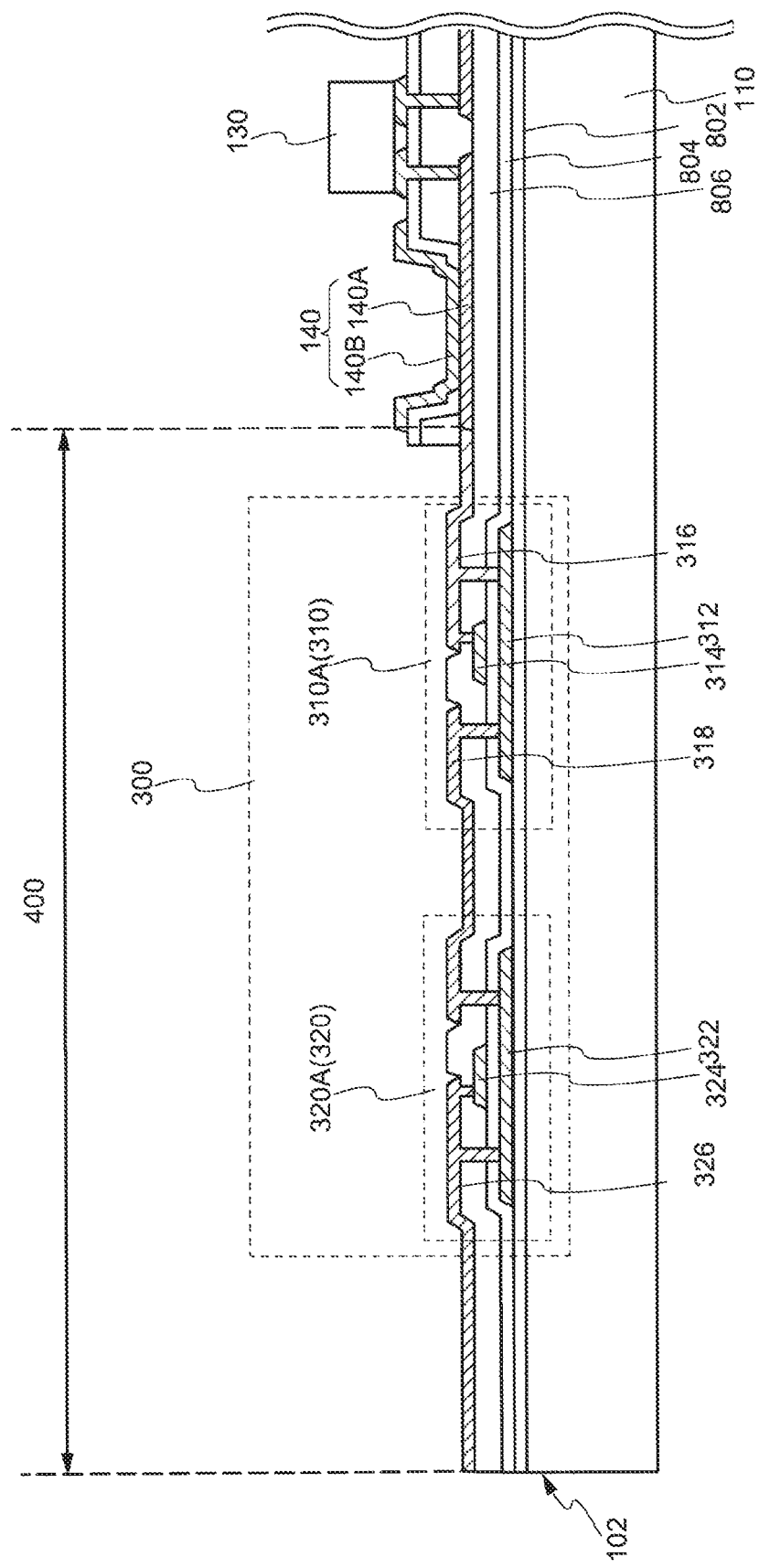
FIG. 5 shows a current blocking unit and a cross-sectional structure of a periphery thereof of a display device related to one embodiment of the present invention.

FIG. 5 shows a cross-sectional structure of the periphery of the current blocking unit 300. A first insulating layer 802, a second insulating layer 804 and a third insulating layer 806 are stacked in order from the bottom on the substrate 110. The first insulating layer 802 and the second insulating layer 804 are formed using an inorganic insulating material such as silicon oxide, silicon nitride or silicon oxynitride.

The terminal 140 includes a first terminal electrode 140A and a second terminal electrode 140B. The first terminal electrode 140A is arranged on the third insulating layer 806 and contacts the drive circuit 130 via a contact hole. The second terminal electrode 140B is arranged on the first terminal electrode 140A and is a concave shape here.

The first rectifier element 310 here is formed by a diode-connected transistor 310A. Diode connection refers to a connection such that a transistor is equivalent to a diode, specifically, it refers to short-circuiting a gate electrode and a drain wiring of a transistor. The transistor 310A includes a semiconductor layer 312 arranged above the first insulating layer 802, second insulating layer 804 (gate insulating layer), gate electrode 314 and drain wiring 316 arranged above the second insulating layer 804, and a source wiring 318. The semiconductor layer 312 is formed form a semiconductor material such as amorphous silicon or polycrystalline silicon or metal oxide. The semiconductor layer 312 is insulated from the gate electrode 314 by the second insulating layer 804. The third insulating layer 806 is arranged on the upper layer side of the gate electrode 314. The drain wiring 316 and source wiring 318 are arranged on the upper layer side of the third insulating layer 806. The drain wiring 316 is electrically connected to the first terminal electrode 140A. In addition, the drain wiring 316 and the gate electrode 314 are short-circuited. Furthermore, the drain wiring 316 and the source wiring 318 are in contact with the semiconductor layer 312 through contact holes formed in the third insulating layer 806, respectively. The gate electrode 314, the drain wiring 316 and the source wiring 318 are formed using a metal material such as aluminum, molybdenum, titanium or tungsten and the like.

The second rectifier element 320 here is formed of a diode-connected transistor 320A. The transistor 320A includes a semiconductor layer 322 arranged above the first insulating layer 802, second insulating layer 804 (gate insulating layer), gate electrode 324 arranged above the second insulating layer 804, and a drain wiring 326. Since each element of the transistor 320A may have the same structure as the element of the same name of the transistor 310A, an explanation thereof is omitted. In the transistor 320A, drain wiring 326 and source wiring 318 are arranged on the upper layer side of the third insulating layer 806. The drain wiring 326 and the gate electrode 324 are short-circuited. Furthermore, the drain wiring 326 and the source wiring 318 are respectively in contact with the semiconductor layer 322 through contact holes formed in the third insulating layer 806. The drain wiring 326 is arranged on the third insulating layer 806 and extends to a position of the end part 102.

As is shown in FIG. 5, the wiring 400 is a wiring part between the end part of the second terminal electrode 140B side on the transistor 310A side and the end part 102.

Next, reasons why the current blocking unit 300 is arranged for each of the wirings 400 is explained.

Figure 6:
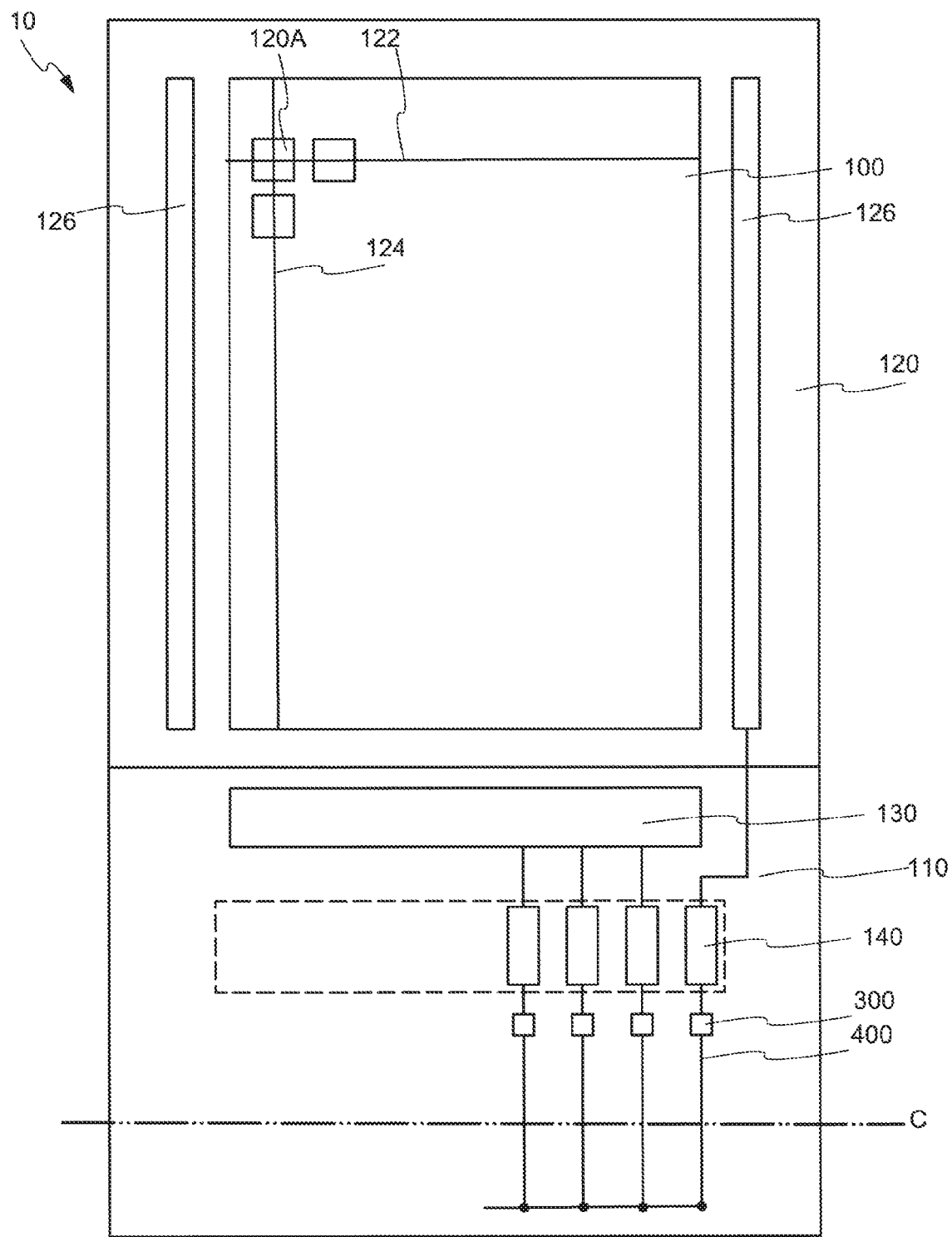
FIG. 6 is a top view showing a structure of a display device during manufacture of the display device related to one embodiment of the present invention.
Figure 7:
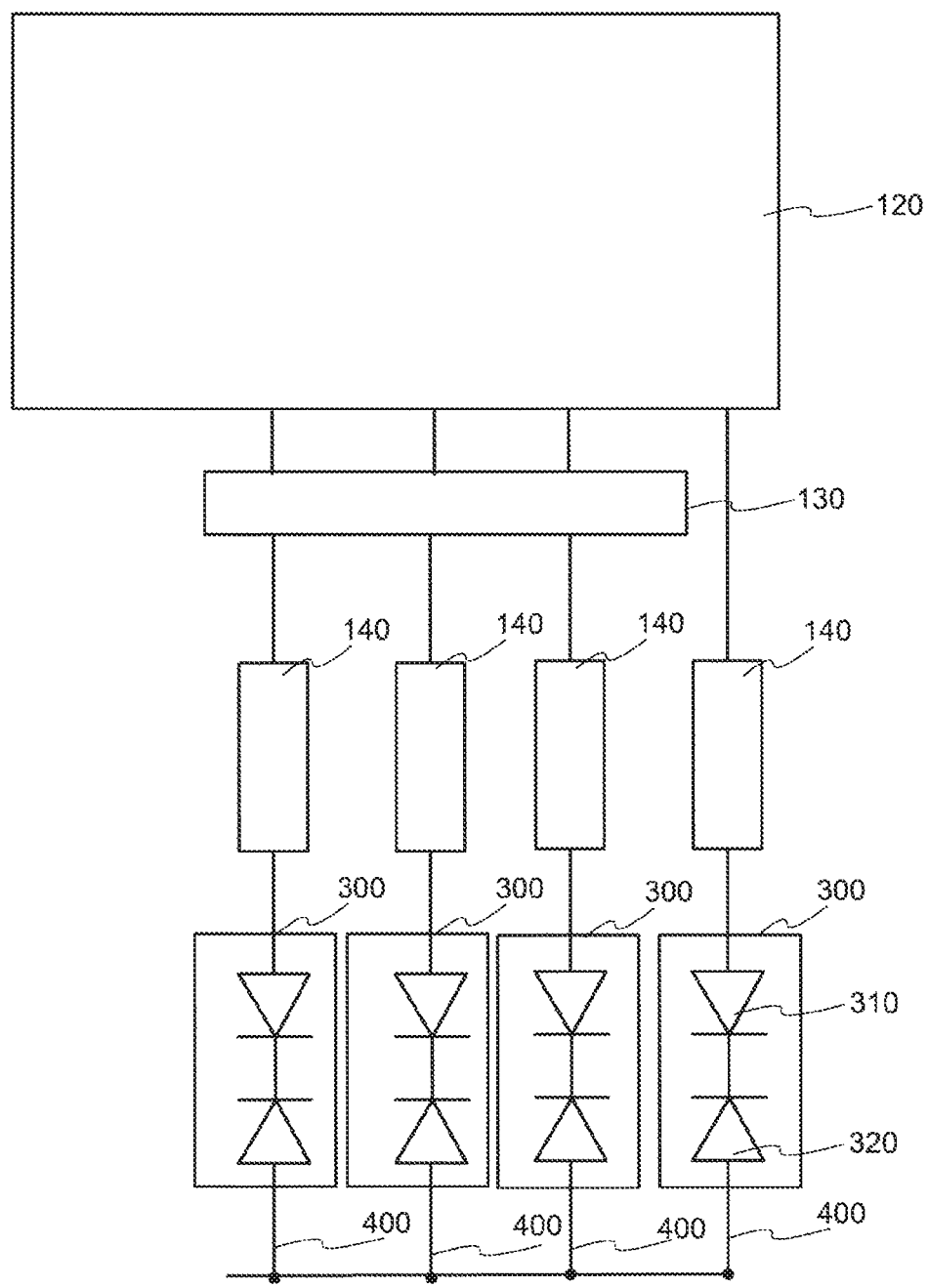
FIG. 7 shows a current blocking unit and the electrical structure of a periphery thereof during manufacture of a display device related to one embodiment of the present invention.

FIG. 6 is a top view showing a structure of a display device during the manufacturing of the display device 10. FIG. 7 shows a current blocking unit 300 and the electrical structure of a periphery thereof during manufacture of the display device 10. The manufacturing method of the display device 10 includes a formation process of forming the plurality of terminals 140 and a plurality of wirings 400 on the substrate 110 arranged on a glass substrate (not shown in the diagram). In the formation process, a thin film transistor and a light emitting element and the like included in the display part 120 may be further formed on the substrate 110.

The plurality of wirings 400 are mutually connected so that end part pairs on the side opposite to the end part on the terminal 140 side are short-circuited. The reason for this connection is to prevent electronic components from being electrostatically destroyed during the manufacture of the display device 10.

In the manufacturing method of the display device 10, a cutting process is carried out after formation process describe above. In the cutting process, the substrate 110 is cut so that the plurality of wirings 400 are mutually separated from each other. Specifically, in the cutting process, the substrate 110 and the plurality of wirings 400 are cut using a laser at the cutting position C shown in FIG. 6. The cutting position C passes between the current blocking unit 300 (more specifically, the second rectifier element 320) and the position where the plurality of wirings 400 are short-circuited.

Figure 8:
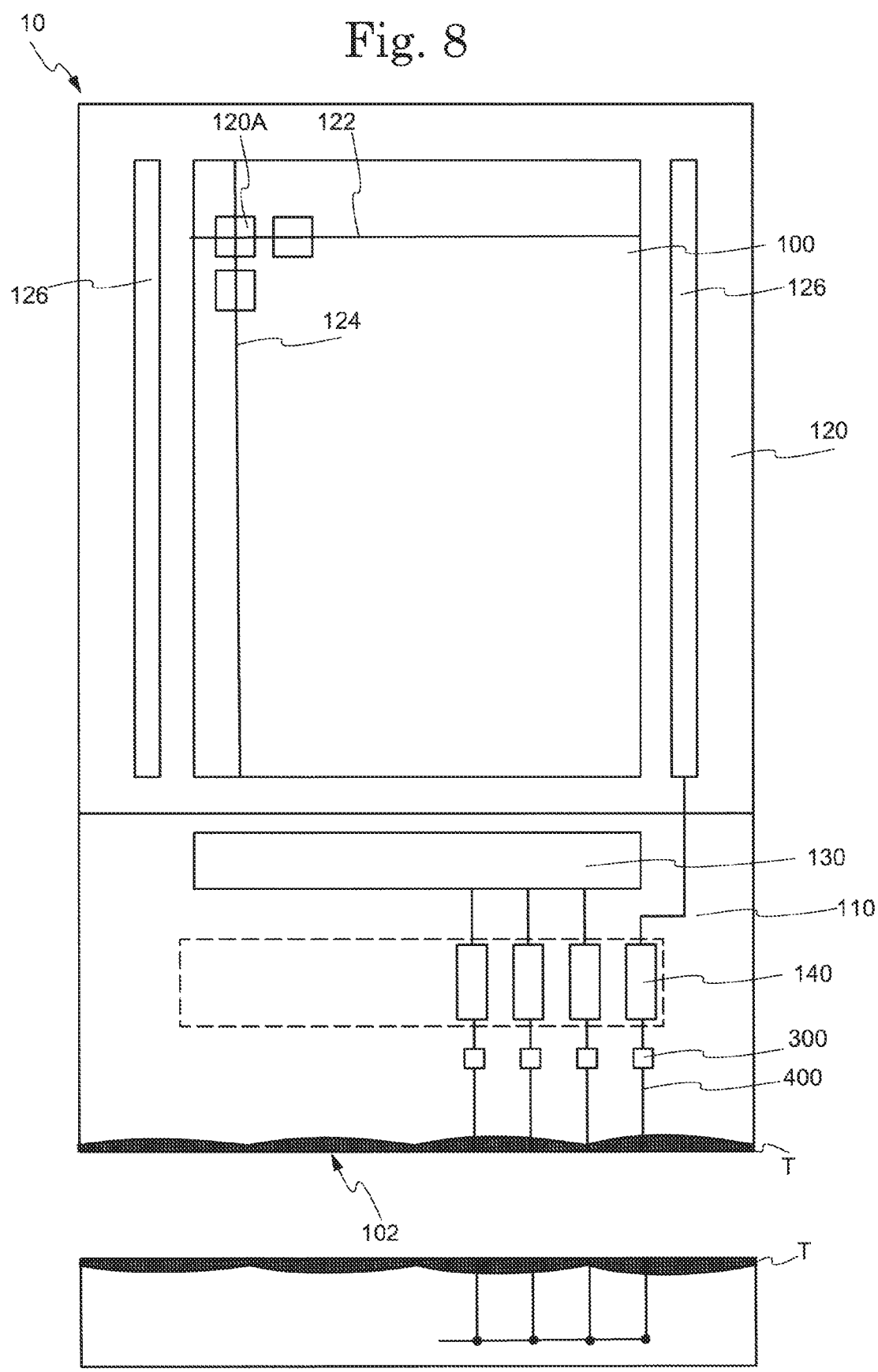
FIG. 8 is a top view showing an example of a structure of a display device after a cutting process related to one embodiment of the present invention.
Figure 9:
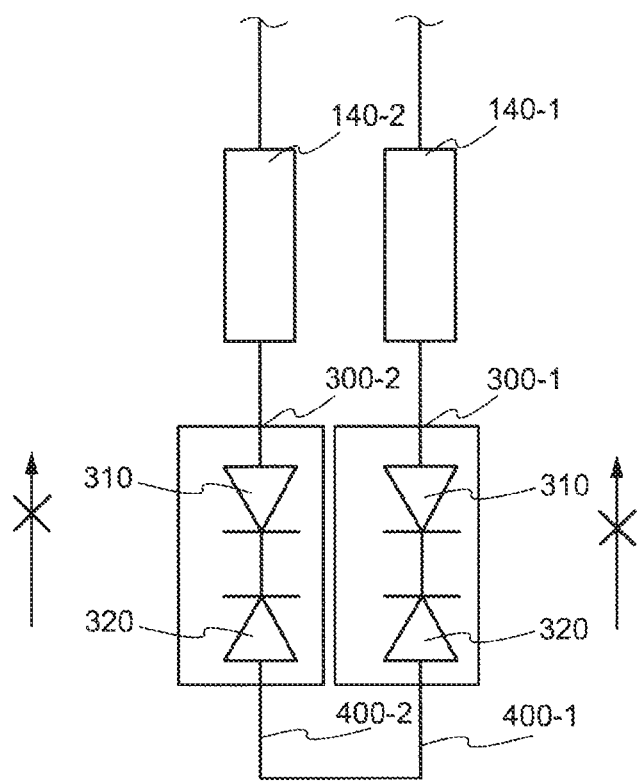
FIG. 9 is a diagram showing a current blocking unit and the electrical structure of a periphery thereof in the case where carbonized region is formed in a display device related to one embodiment of the present invention.
Figure 17:
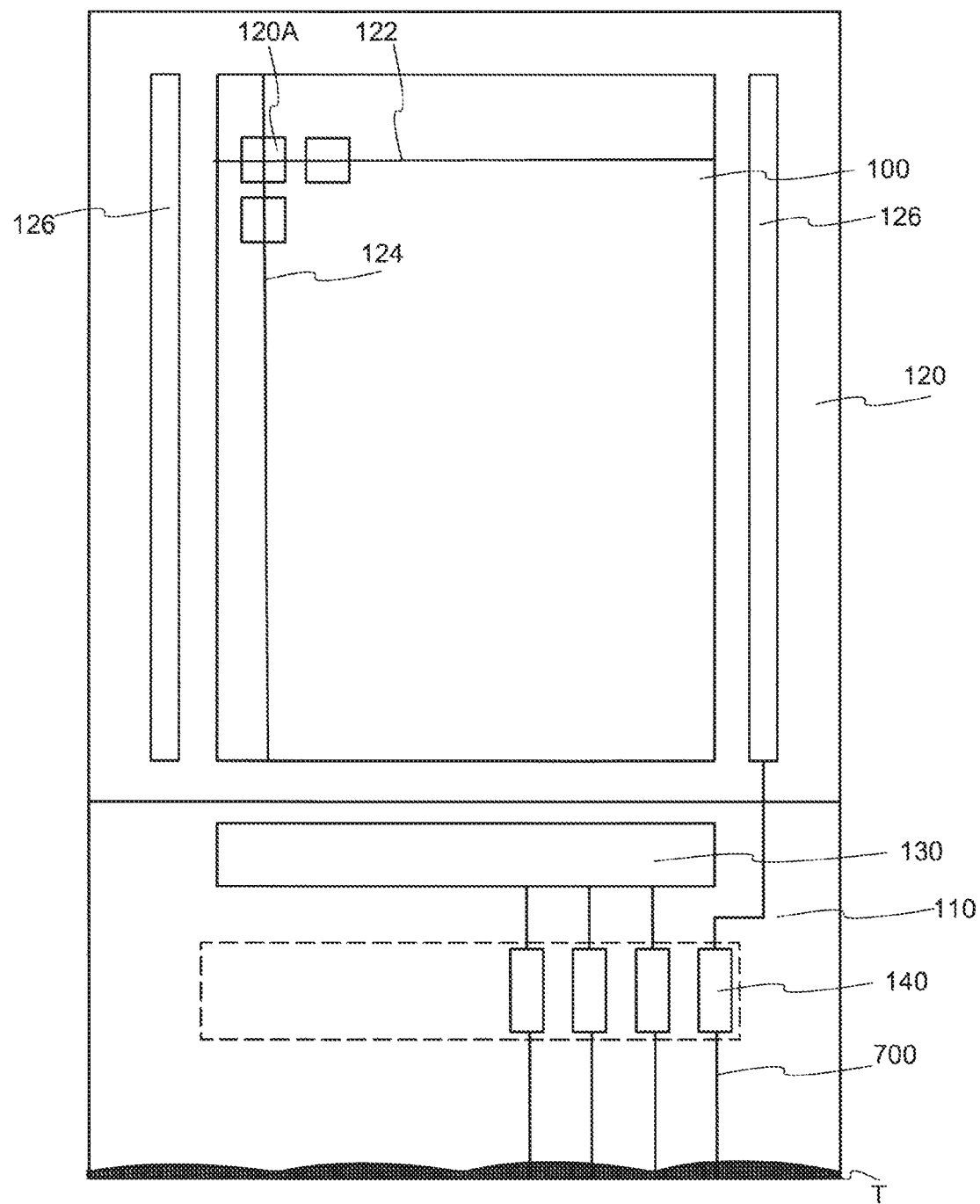
FIG. 17 is top view showing a structure of a display device which is not arranged with a current blocking unit.
Figure 18:
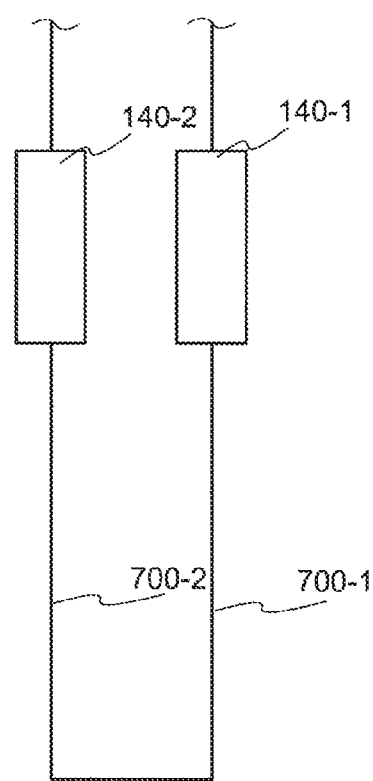
FIG. 18 shows the electrical structure of a display device which is not arranged with a current blocking unit.

FIG. 8 is a top view showing an example of the structure of the display device 10 after the cutting process. FIG. 9 is a diagram showing a current blocking unit 300 and the electrical structure of a periphery thereof of the display device 10 after the cutting process. After the cutting process, as is shown in FIG. 8, a carbonized region T which is a region where the resin of the substrate 110 is carbonized may be formed. In the example of FIG. 8, although the carbonized region T is in contact with the entire cutting position C, there may also be a case where it is in contact with only a part of the cutting position C. The carbonized region T is a region in which a resin is carbonized and has conductivity. As a result, a part or all of the plurality of wirings 400 may be in a short-circuited state even after the cutting process. As is shown in FIG. 17, in the case where the wiring 700 which is not arranged with the current blocking unit 300 is adopted, the electrical configuration of the display device is as shown in FIG. 18. Here, the wiring 700 which has a first end part electrically connected to the first terminal 140-1 and has a second end part opposite to the first end part located at the end part 102, is connected to the first wiring 700-1. In addition, the wiring 700 which has a third end part electrically connected to the second terminal 140-2 and has a fourth end part opposite to the third end part located at the end part 102, is connected to the second wiring 700-2. The first terminal 140-1 and the second terminal 140-2 are adjacent to each other. In this case, since the first wiring 700-1 and the second wiring 700-2 are short-circuited, the first terminal 140-1 and the second terminal 140-2 are short-circuited. This type of short circuit between pairs of terminals 140 is the cause of operation malfunctions in the display device 10.

On the other hand, since the current blocking unit 300 exists in the display device 10, pairs of terminals 140 are prevented from short-circuiting each other.

FIG. 9 shows the current blocking unit 300 and the electrical structure of a periphery thereof when the carbonized area T is formed. FIG. 9 shows an electrical connection with respect to two terminals 140 arbitrarily selected from the plurality of terminals 140. Here, the wiring 400 which has a first end part electrically connected to the first terminal 140-1 and has a second end part opposite to the first end part located at the end part 102, is connected to the first wiring 400-1. The wiring 400 which has a third end part electrically connected to the second terminal 140-2 and has a fourth end part opposite to the third end part located at the end 102 is referred to as a second wiring 400-2. In addition, the first wiring 400-1 is arranged with a first current blocking unit 300-1 for blocking a current which flows in the direction of the first terminal 140-1. As described above, the first current blocking unit 300-1 includes the first rectifier element 310 and the second rectifier element 320 which face in mutually opposite directions. In addition, the second wiring 400-2 is arranged with a second current blocking unit 300-2 for blocking a current which flows in the direction of the second terminal 140-2. Similar to the first current blocking unit 300-1, the second current blocking unit 300-2 also includes a first rectifier element 310 (third rectifier element) and a second rectifier element 320 (fourth rectifier element) which face in mutually opposite directions.

As is shown in FIG. 9, even when the first wiring 400-1 and the second wiring 400-2 are short-circuited by the carbonized region T after the cutting process, the first terminal 140-1 and the second terminal 140-2 are not short-circuited. This is because the first current blocking unit 300-1 blocks the current flowing to the first terminal 140-1 and the second current blocking unit 300-2 blocks the current flowing to the second terminal 140-2. Therefore, the occurrence of operation malfunctions of the display device 10 can be suppressed. In addition, the first current blocking unit 300-1 and the second current blocking unit 300-2 also block a current which flows in the direction of the end part 102. Therefore, signals which are input to the first terminal 140-1 and the second terminal 140-2 are prevented from flowing to the carbonized region T.

Furthermore, processes such as peeling the glass substrate on which the substrate 110 is arranged from the substrate 110, a process of arranging the first film 210 to the sixth film 260, and a process of cleaning the display device 10 are performed during or after the formation process described above.

2. MANUFACTURING METHOD OF DISPLAY DEVICE 10

An example of a detailed manufacturing method of the display device 10 is explained. FIG. 10 to FIG. 14 are diagrams for explaining a manufacturing method of the display device 10. An explanation of the manufacturing method of the display device 10 is explained below using the same reference numerals as in FIG. 9.

Figure 10:
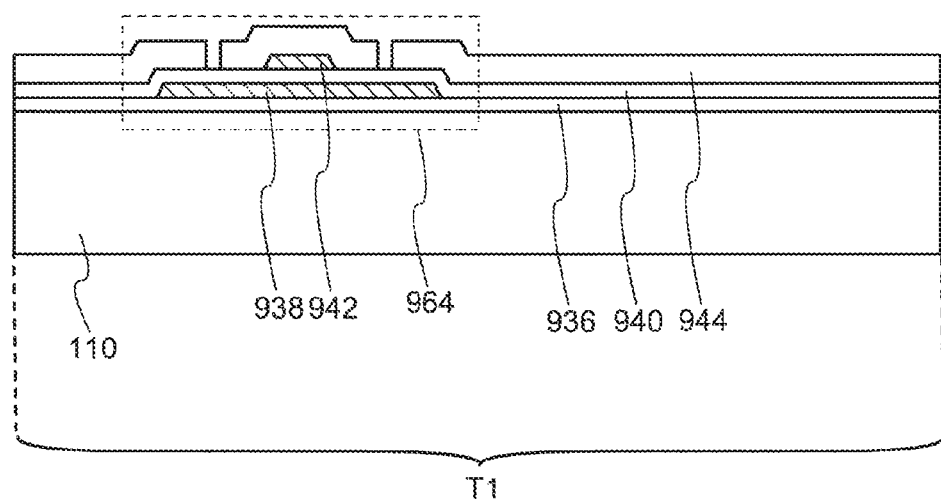
FIG. 10 is a diagram for explaining a manufacturing method of a display device related to one embodiment of the present invention.
Figure 11:
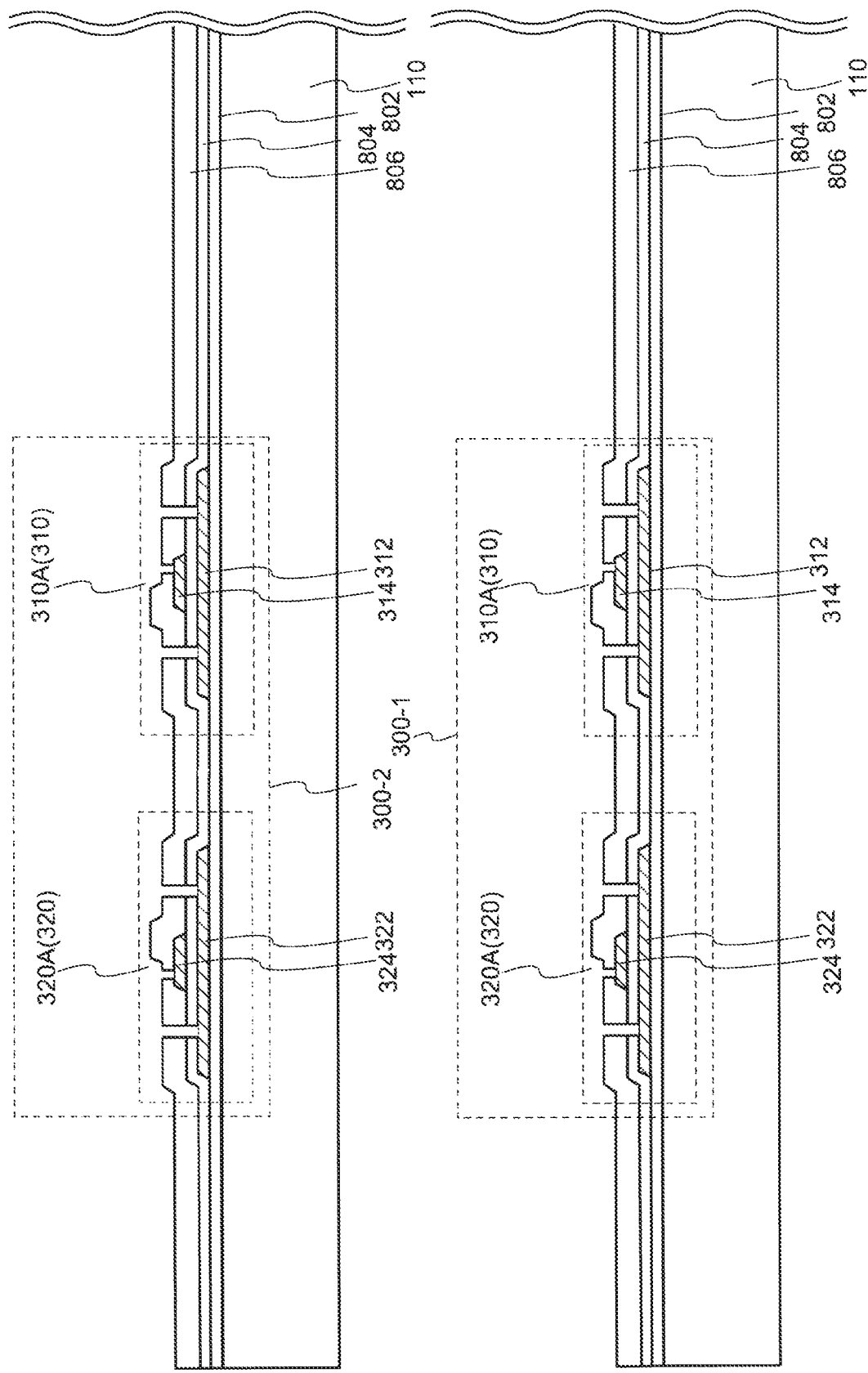
FIG. 11 is a diagram for explaining a manufacturing method of a display device related to one embodiment of the present invention.

FIG. 10 and FIG. 11 are diagrams for explaining a first process of the method of manufacturing the display device 10. In the first process, a transistor 964 (first transistor), a transistor 310A (second transistor) of the first current blocking unit 300-1, and a transistor 320A (third transistor) of the second current blocking unit 300-2, a transistor 320A (fourth transistor) and a transistor 310A (fifth transistor) of the second current blocking unit 300-2 are formed. Specifically, as is shown in FIG. 10, in the first process, a first insulating layer 936, a semiconductor layer 938, a second insulating layer 940, a gate electrode 942 and a third insulating layer 944 are formed in sequence on the substrate 110. The transistor 964 is formed in a pixel region T1 which is a region where the pixel 120A is formed. In addition, as is shown in FIG. 11, in the first process, the first insulating layer 802, the semiconductor layers 312 and 322, the second insulating layer 804 (gate insulating layer), the gate electrodes 314 and 324 and the third insulating layer 806 are formed in sequence on the first substrate 110. Furthermore, holes for forming a source/drain wiring, a drain wiring, or a source wiring described later are opened in each insulating layer.

The substrate 110 is formed by applying a wet film forming method such as a printing method, an inkjet method, a spin coating method or a dip coating method, or a laminating method and the like. Each insulating layer is formed by applying chemical vapor deposition (CVD) or a sputtering method and the like. The semiconductor layer is formed using, for example, a heat treatment, light irradiation such as laser and a sputtering method or the like. The gate electrode is formed by a sputtering method or a CVD method.

Figure 12:
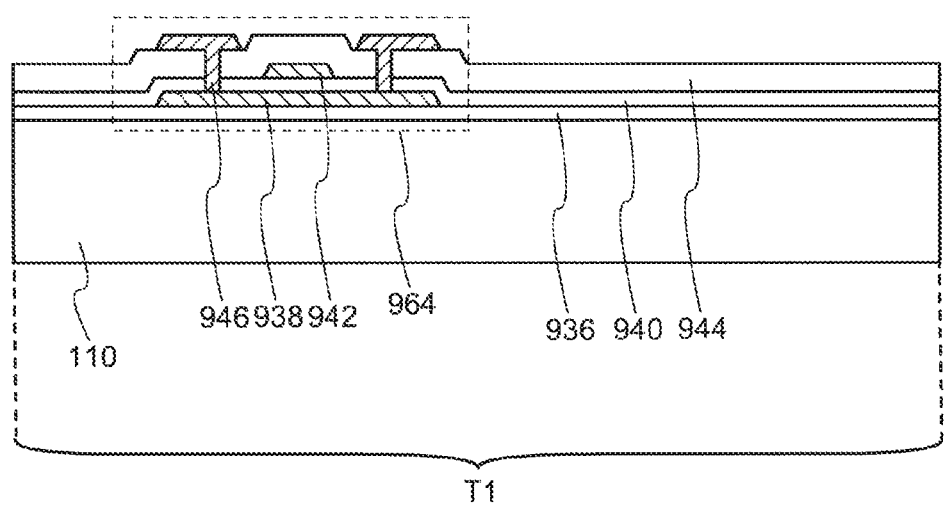
FIG. 12 is a diagram for explaining a manufacturing method of a display device related to one embodiment of the present invention.
Figure 13:
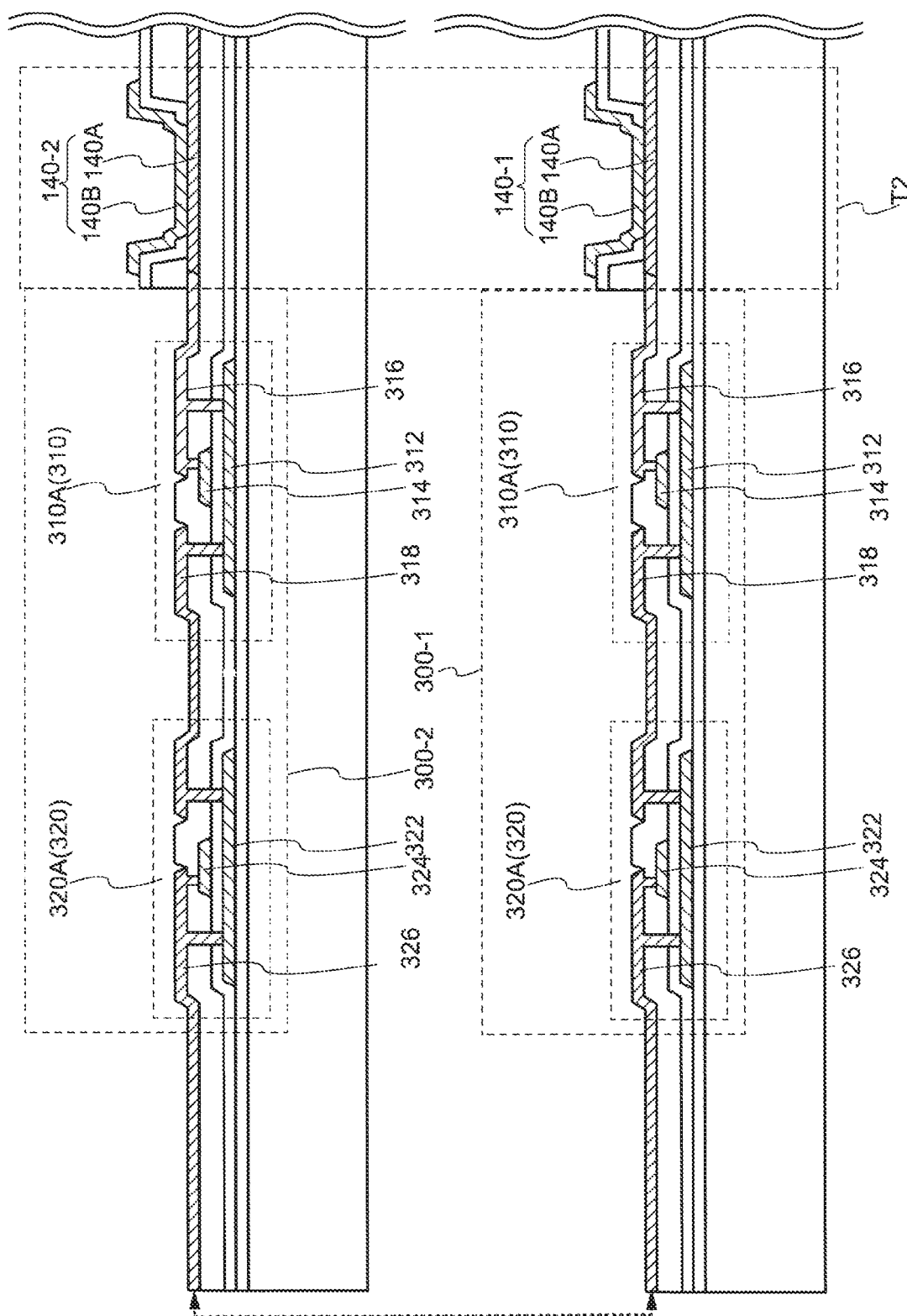
FIG. 13 is a diagram for explaining a manufacturing method of a display device related to one embodiment of the present invention.

FIG. 12 and FIG. 13 are diagrams for explaining a second process of the manufacturing method of the display device 10. In the second process, as is shown in FIG. 12, the source/drain wiring 946 (first wiring) of the transistor 964 is formed over the substrate 110. In addition, in the second process, as is shown in FIG. 13, a drain wiring 316 (second wiring) which electrically connects the first terminal 140-1 and the second terminal 140-2 of a terminal part T2, the transistor 310A of the first terminal 140-1 and the transistor 310A of the first current blocking unit 300-1, a source wiring 318 (third wiring) which electrically connects the transistor 310A and the transistor 320A of the first current blocking unit 300-1, a drain wiring 326 (fourth wiring) which electrically connects the transistor 320A of the first current blocking unit 300-1 and the transistor 320A of the second current blocking unit 300-2, a source wiring 318 (fifth wiring) which electrically connects the transistor 320A and the transistor 310A of the second current blocking unit 300-2, and a drain wiring 316 (sixth wiring) which electrically connects the transistor 310A of the second current blocking unit 300-2 and a second terminal 140-2 of the terminal part T are formed.

Here, the terminal part T2 is adjacent to each of the first current blocking unit 300-1 and the second current blocking unit 300-2 respectively. The drain wiring of each transistor of the first current blocking unit 300-1 and the second current blocking unit 300-2 is connected to a gate electrode. In addition, the drain wiring 326 of the first current blocking unit 300-1 and the second current blocking unit 300-2 are integrated. Therefore, the drain of the first current blocking unit 300-1 and the drain of the second current blocking unit 300-2 are short-circuited. In addition, here the source wiring 318 also serves as a source wiring of the transistor 310A and the transistor 320A. Each electrode is formed using a method for performing etching and molding after forming a metal film so as to cover an opening. That is, the drain wiring 326 is arranged in the same process as the process for completing each transistor on the substrate 110. In addition, in the second process, the drive circuit 130 may be further formed on the substrate 110.

Figure 14:
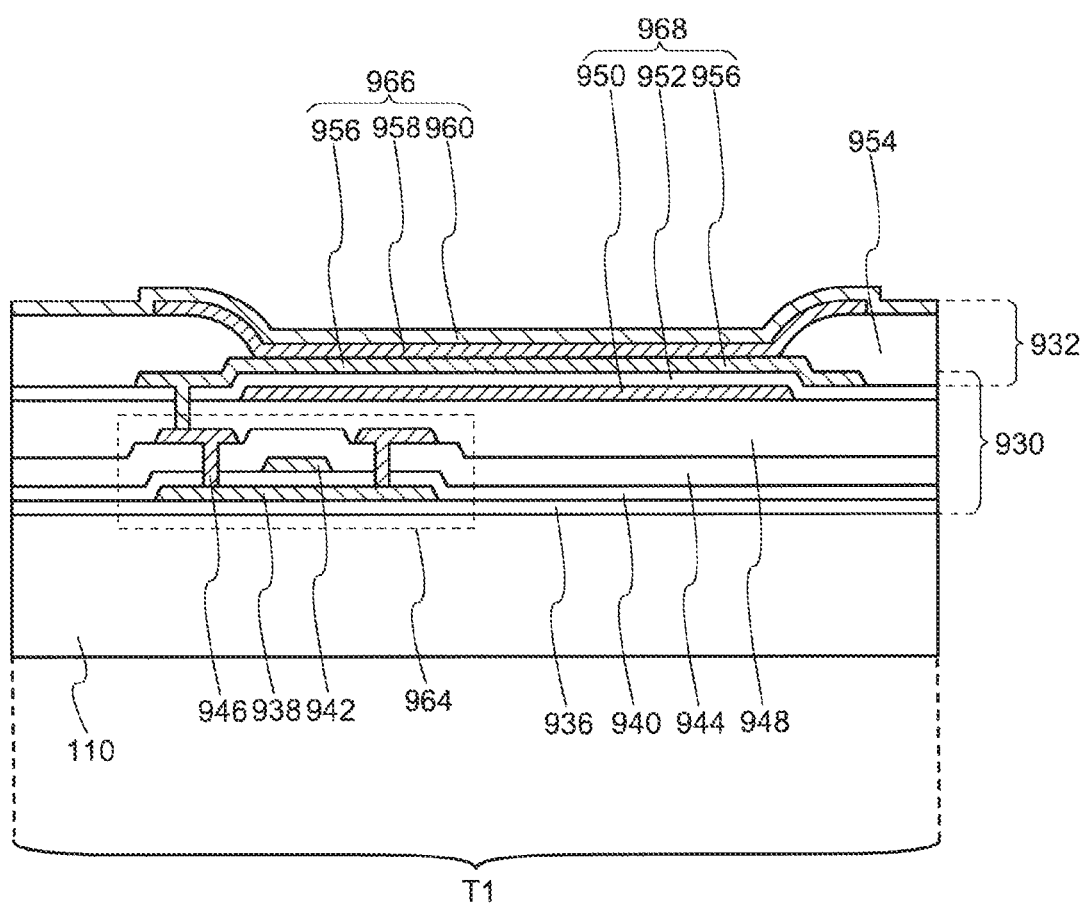
FIG. 14 is a diagram for explaining a manufacturing method of a display device related to one embodiment of the present invention.

FIG. 14 is a diagram for explaining a third process of the manufacturing method of the display device 10. The third process includes a process of forming the light emitting element 966 on the substrate 110 so as to be electrically connected with the transistor 964. Specifically, in the third process, a fourth insulating layer 948 is formed above the semiconductor layer 938, the gate electrode 942 and the source/drain wiring 946. Furthermore, in the third process, a capacitor electrode 950 and a fifth insulating layer 952 are formed in sequence on the upper surface of the fourth insulating layer 948, the first electrode 956, the organic layer 958 and the second electrode 960. The method for forming the insulating layers and each electrode may be the same as the method already explained. Due to the presence of the first current blocking unit 300-1 and the second current blocking unit 300-2, the light emitting element 966 can be prevented from being electrostatically destroyed after the transistor 964 and the light emitting element 966 are electrically connected. A printing method is used for formation of the organic layer 958, for example, and a baking method is used after applying ink containing the constituent material in the opening defined by the partition wall 954. Following this, the sealing layer 934 is formed.

The fourth process is a cutting process for cutting the substrate 110 so as to divide the drain wiring 326. Following the cutting process, the cross-sectional structure of the periphery of the current blocking unit 300 of the display device 10 is as shown in FIG. 5. It is desirable that the fourth process is performed at a later stage in the manufacturing process of the display device 10 as much as possible. For example, the fourth process may be performed after the drive circuit 130 is formed on the substrate 110.

It is possible to prevent the terminals 140 arranged on the substrate 110 from being short-circuited even after the substrate 110 is cut by using the manufacturing method of the display device 10 explained above.

3. MODIFIED EXAMPLE

The embodiments described above can be applied by being combined or replaced with each other. In addition, in the embodiments described above, it is also possible to modify and implement as follows.

Modified Example 1

Figure 15:
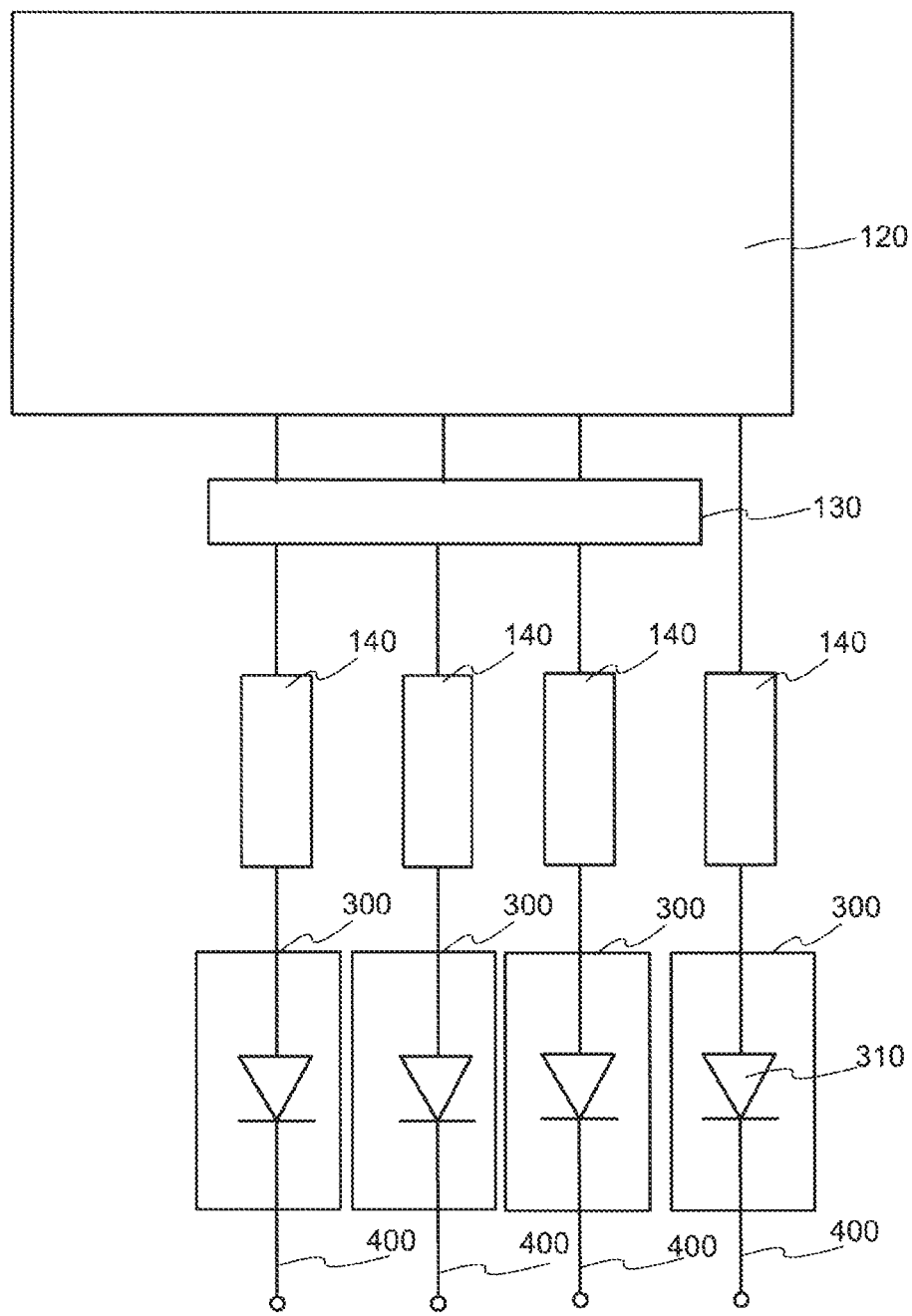
FIG. 15 shows a current blocking unit and the electrical structure of a periphery thereof of a display device related to a modified example of the present invention.

As is shown in FIG. 15, the current blocking unit 300 may have a structure in which the second rectifier element 320 is not included. In this case also, the presence of the first rectifier element 310 of the current blocking unit 300 prevents electrostatic destruction of electronic components.

Modified Example 2

Figure 16:
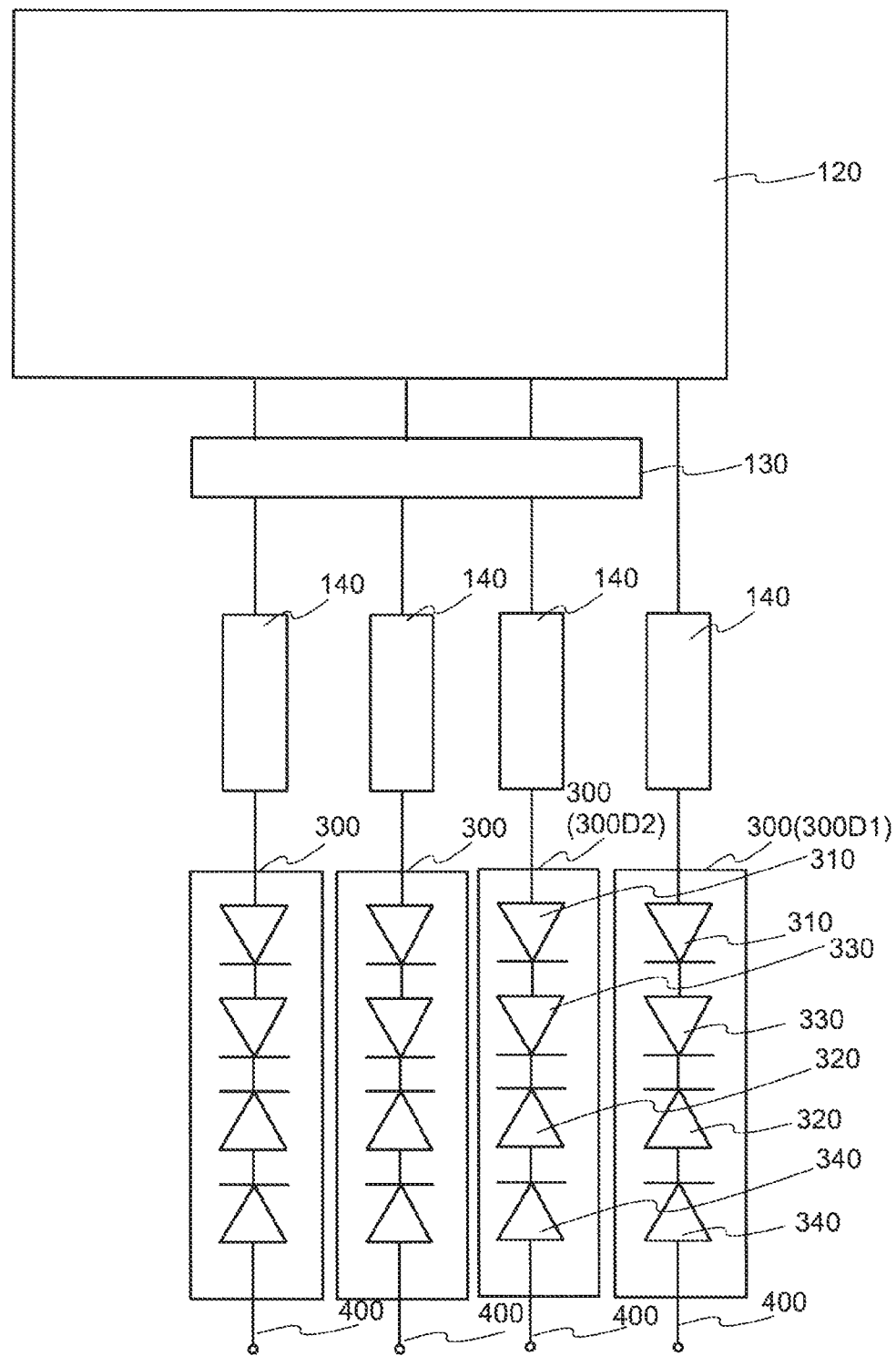
FIG. 16 shows a current blocking unit and the electrical structure of a periphery thereof of a display device related to a modified example of the present invention.

A plurality of (two or more) diodes may be arranged for one wiring 400 in order to block a current flowing to the terminal 140. In the example shown in FIG. 16, the current blocking unit 300D1 which is one of a plurality of current blocking units 300, includes a first rectifier element 310 for blocking a current flowing to the terminal 140 and a first rectifier element 330. In this way, even in the case when one of the first rectifier element 310 and the first rectifier element 330 is damaged, the possibility that a pair of terminals 140 will be short-circuited is reduced. In addition, the current blocking unit 300D1 includes a second rectifier element 320 and a second rectifier element 340 which face in an opposite direction to the first rectifier elements 310 and 330. The first rectifier element 310, the first rectifier element 330, the second rectifier element 320 and the second rectifier element 340 are connected in series. The other current blocking unit 300 may also have the same structure as the current blocking unit 300D1. For example, the current blocking unit 300D2 which is one of a plurality of current blocking units 300, may also include the first rectifier element 310, the first rectifier element 330 (third rectifier element), the second rectifier element 320 and the rectifier element 340 (fourth rectifier element).

Modified Example 3

The number of rectifier elements for preventing a current from flowing to the terminal 140 and the number of rectifier elements facing in the opposite direction may be three or more, respectively. In addition, the number of rectifier elements for preventing a current from flowing to the terminal 140 and the number of rectifier elements facing in the opposite direction may be different.

Modified Example 4

In the embodiments described above, although the case where the current blocking unit 300 includes a diode-connected transistor as a rectifier element was explained. However, the current blocking unit 300 may also include a diode or an element or a circuit which restricts the flow of other currents in one direction.

Modified Example 5

A current which flows to a terminal other than a terminal which is electrically connected to the flexible printed circuit 150 may be blocked by the current blocking unit. For example, the display device 10 may have a plurality of inspection terminals for inspecting the display device 10. This inspection terminal is arranged in order to inspect the display device 10 before product shipment or after product shipment. The terminal for inspection is a terminal which is input with a predetermined inspection signal. The inspection of the display device 10 includes an inspection for confirming whether or not the display part 120 of the display device 10 performs a predetermined operation when an inspection signal is input to the inspection terminal. In order to ensure that pairs of inspection terminals are not short-circuited by the cutting process, the display device may be arranged with a plurality of wirings including a first end part and a third end part electrically connected to a testing terminal, and a second end part on the opposite side to the first part and a fourth part on the opposite side to the third part located in an end part of the substrate, and a current blocking unit arranged on the plurality of wires and blocking a current flowing to the inspection terminals.

Modified Example 6

Although the case of an organic EL display device is exemplified in the embodiments described above as a disclosed example, other self-light emitting type display devices, liquid crystal display devices or electronic paper type display devices such as electrophoretic elements or flat panel type display devices can be given as another application example.

Furthermore, within the scope of the concept of the present invention, those skilled in the art could conceive of various modifications and correction examples and such modifications and correction examples are also to be understood as belonging to the scope of the present invention. For example, those skilled in the art could appropriately add, delete or change the design of the constituent elements based on the display device of each embodiment, or add, omit or change conditions as long as it does not depart from the concept of the present invention and such changes are included within the scope of the present invention.

What is claimed is:

1. A display device comprising:
    a substrate;
    a plurality of pixels on the substrate;
    a drive circuit on the substrate;
    a first terminal and a second terminal which are electrically connected to the pixels or the drive circuit and are arranged on the substrate;
    a first wiring having a first end part electrically connected with the first terminal, and a second end part located on an end part of the substrate;
    a second wiring having a third end part electrically connected with the second terminal, and a fourth end part located on an end part of the substrate;
    a first current blocking unit blocking a first current flowing in a direction from the second end part to the first end part of the first wiring; and
    a second current blocking unit blocking a second current flowing in a direction from the fourth end part to the third end part of the second wiring.

2. The display device according to claim 1, wherein each of the first current blocking unit and the second current blocking unit includes at least one rectifier element.

3. The display device according to claim 2, wherein the first current blocking unit includes a first rectifier element blocking the first current flowing, and a second rectifier element facing in a reverse direction to the first rectifier element, and the second current blocking unit includes a third rectifier element blocking the second current flowing, and a fourth rectifier element facing in a reverse direction to the third rectifier element.

4. The display device according to claim 3, wherein the first current blocking unit includes a plurality of the first rectifier elements and a plurality of the second rectifier elements, and the second current blocking unit includes a plurality of the third rectifier elements and a plurality of the fourth rectifier elements.

5. The display device according to claim 2, wherein the rectifier element includes a diode connected transistor.

6. The display device according to claim 1, wherein the first terminal and the second terminal are electrically connected to a flexible printed circuit.

7. The display device according to claim 1, wherein the substrate includes a resin.

8. The display device according to claim 1, wherein the first terminal is adjacent to the second terminal.

9. The display device according to claim 1, wherein each of the plurality of pixels includes a light emitting element.

* * * * *